US008677293B2

(12) United States Patent
Jensen

(10) Patent No.: US 8,677,293 B2
(45) Date of Patent: Mar. 18, 2014

(54) FEASIBILITY OF IC EDITS

(75) Inventor: Lance Christopher Jensen, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 696 days.

(21) Appl. No.: 12/341,505

(22) Filed: Dec. 22, 2008

(65) Prior Publication Data

US 2010/0162190 A1    Jun. 24, 2010

(51) Int. Cl.
*G06F 17/50*   (2006.01)
*G06F 9/45*    (2006.01)
*G06F 9/455*   (2006.01)

(52) U.S. Cl.
USPC .............. 716/106; 716/50; 716/51; 716/52; 716/53; 716/54; 716/115; 716/132; 703/22; 703/26

(58) Field of Classification Search
USPC ........... 716/50–54, 115, 132, 106; 703/22, 26
See application file for complete search history.

(56) References Cited

U.S. PATENT DOCUMENTS

| | | | | |
|---|---|---|---|---|
| 5,530,372 A * | 6/1996 | Lee et al. | ............. | 324/754.03 |
| 5,675,499 A * | 10/1997 | Lee et al. | ............. | 324/755.01 |
| 6,171,944 B1 * | 1/2001 | Li et al. | ............. | 438/622 |
| 6,753,253 B1 * | 6/2004 | Takahashi et al. | ............. | 438/676 |
| 6,824,336 B2 * | 11/2004 | Izutsu et al. | ............. | 409/132 |
| 6,886,153 B1 * | 4/2005 | Bevis | ............. | 716/51 |
| 7,117,476 B2 * | 10/2006 | Bach et al. | ............. | 716/52 |
| 7,135,678 B2 * | 11/2006 | Wang et al. | ............. | 250/310 |
| 7,149,668 B2 * | 12/2006 | Schwanecke et al. | ............. | 703/7 |
| 7,303,860 B1 * | 12/2007 | Vogeli et al. | ............. | 430/316 |
| 7,310,789 B2 * | 12/2007 | Seligson et al. | ............. | 716/52 |
| 7,348,069 B2 * | 3/2008 | Ichiyanagi et al. | ............. | 428/631 |
| 7,488,937 B2 * | 2/2009 | Le Roy et al. | ............. | 250/310 |
| 7,514,355 B2 * | 4/2009 | Katase et al. | ............. | 438/637 |
| 7,530,034 B2 * | 5/2009 | Betz et al. | ............. | 716/132 |
| 7,546,232 B2 * | 6/2009 | Brooks et al. | ............. | 702/183 |
| 7,752,591 B2 * | 7/2010 | Matsumoto | ............. | 716/115 |
| 7,842,920 B2 * | 11/2010 | Lundquist | ............. | 250/306 |
| 2002/0129485 A1 * | 9/2002 | Mok et al. | ............. | 29/527.2 |
| 2004/0128120 A1 * | 7/2004 | Coburn et al. | ............. | 703/26 |
| 2005/0216877 A1 * | 9/2005 | Pack et al. | ............. | 716/19 |
| 2007/0051622 A1 * | 3/2007 | Tang et al. | ............. | 204/298.01 |
| 2008/0028345 A1 * | 1/2008 | Suri et al. | ............. | 716/2 |
| 2010/0264111 A1 * | 10/2010 | Makarov | ............. | 216/13 |
| 2010/0298961 A1 * | 11/2010 | Frisken et al. | ............. | 700/103 |

\* cited by examiner

*Primary Examiner* — Helen Rossoshek
(74) *Attorney, Agent, or Firm* — Alan A. R. Cooper; W. James Brady, III; Frederick J. Telecky, Jr.

(57) ABSTRACT

One embodiment relates to a computer method of evaluating proposed edits to a target layer of an integrated circuit. In the method, a number of editable regions is determined for metal layers overlying the target layer, where an editable region for a metal layer is laterally arranged between segments of the metal layer. The method identifies a number of possible vertical milling paths that extend from an exterior surface of the integrated surface to the target layer. Each possible vertical milling path passes through at least one editable region. The method generates a number of possible edit plans that are based on both the proposed edits and the number of possible vertical milling paths, where each edit plan places edits in a different combination of possible vertical milling paths.

23 Claims, 6 Drawing Sheets

FEASIBILITY OF IC EDITS

FIELD

The disclosure herein relates generally to integrated circuits, and more particularly for systems and methods for determining feasibility of integrated circuit edits.

BACKGROUND

Integrated circuits are generally mass produced by a design company and sold to client companies. In designing the integrated circuit, engineers at the design company use computer-aided tools to develop an electronic mask set, which represents different layers of the integrated circuit. This electronic mask set is then used to generate a set of physical masks, which are in turn used to fashion features on different layers of a physical integrated circuit during the manufacturing process.

After a client company receives the integrated circuit, the client company may need to modify the integrated circuit to make it more suitable for a particular application or environment. Consequently, after studying the electronic mask set or the physical integrated circuit, engineers at the client company can propose edits to be implemented on the integrated circuit. These edits can be sent to the design company via email, a web interface or other means of communication.

After receiving the proposed edits, engineers at the design company then manually evaluate the electronic mask set in view of the proposed edits and conduct a feasibility study. In a feasibility study, the engineers may first determine whether the proposed edits are even possible, and then assuming they are possible, the engineers may characterize the proposed edits as aggressive or conservative. Such evaluations generally are manually performed, wherein the engineers use their own knowledge of integrated circuit design rules and milling procedures to evaluate the feasibility of the proposed edits. After conducting this feasibility study, the design company can make the proposed edits on the actual integrated circuit via focused ion beam (FIB) milling technology.

However, numerous disadvantages arise when attempting to manually determine whether a particular integrated circuit edit is feasible. For example, because engineers rely on personal experience and their own integrated circuit editing knowledge, which may be limited or incomplete, engineers usually are unable to thoroughly and efficiently analyze an integrated circuit to determine whether a proposed edit is truly feasible. Further, if a proposed edit is determined to be unfeasible, engineers may find it difficult to suggest a viable alternative to the proposed edit, even though a viable alternative may exist. Often, visually inspected edits are rejected based solely on an engineer's impression of the difficulty level of the proposed edit, even though such an edit may have a reasonable chance for success. For these and other various reasons, engineers often cannot accurately determine the probability of a successful integrated circuit edit, and are often unable to consistently provide viable alternatives to unsuitable, proposed integrated circuit edits.

BRIEF SUMMARY

The following presents a summary to provide a basic understanding of one or more aspects of the disclosure herein. This summary is not an extensive overview. It is intended neither to identify key or critical elements nor to delineate scope of the disclosure herein. Rather, its primary purpose is merely to present one or more aspects in a simplified form as a prelude to a more detailed description that is presented later.

One embodiment relates to a computer method of evaluating proposed edits to a target layer of an integrated circuit. In the method, a number of editable regions is determined for metal layers overlying the target layer, where an editable region for a metal layer is laterally arranged between segments of the metal layer. The method identifies a number of possible vertical milling paths that extend from an exterior surface of the integrated surface to the target layer. Each possible vertical milling path passes through at least one editable region. The method generates a number of possible edit plans that are based on both the proposed edits and the number of possible vertical milling paths, where each edit plan places edits in a different combination of possible vertical milling paths.

The following description and annexed drawings set forth certain illustrative aspects. Other aspects, advantages and/or features may, however, become apparent from the following detailed description when considered in conjunction with the annexed drawings.

DETAILED DESCRIPTION

Figure 1:
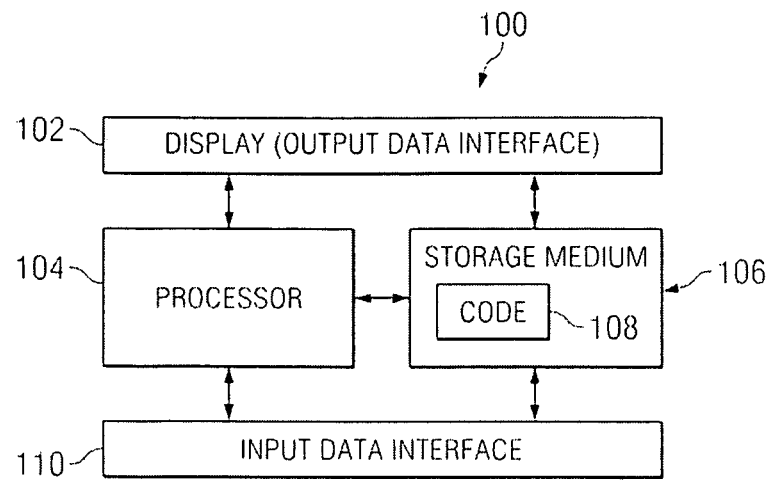
FIG. 1 shows a functional block diagram of a system in accordance with some embodiments.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details.

Described herein is an automated process of accurately and thoroughly analyzing an integrated circuit to determine the feasibility of various proposed edits. Such a feasibility study may comprise determining which of a variety of milling sites will be the most conservative and provide the greatest clearance, whether it is possible to mill a particular metal layer in the integrated circuit without violating design rules, and so forth. One process may comprise an algorithm that uses design rules, FIB machinery characteristics, and the various integrated circuit properties to perform mathematical calculations and generate empirical data in order to determine whether a proposed edit is feasible.

Results of the process may be output in the form of a computer file. For example, the process may analyze the integrated circuit and determine various portions of the integrated circuit that are suitable for milling and editing, and then produce a computer file such as an electronic mask set in Graphical Data System Stream (.gdsii) format, Caltech intermediate file format, OASIS format, etc. In some embodiments, the file containing the edits may be merged with another computer file containing a mask data set of the original unedited integrated circuit. In at least some embodiments, the process may generate and evaluate alternative locations suitable for milling and/or editing to improve upon originally proposed edits. Several more detailed embodiments are discussed below in greater detail.

FIG. 1 depicts a system 100 for implementing the processes described herein. The system 100 includes a display 102 coupled to a processor 104. The processor 104 may be coupled with a storage medium 106 such as volatile or non-volatile memory that stores processor executable code 108 capable of causing the processor 104 to perform the processes described herein. An electronic mask set, design rules, and other appropriate programs and files may also be stored in the storage medium 106 and are often input via an input data interface 110. The processor 104 may retrieve and execute the code 108 to analyze the electronic mask set and produce an image that may be combined with an original version of the electronic mask set to produce a final electronic mask set. The final electronic mask set, which indicates suitable milling locations, may then be displayed on the display 102 for use by the tool operator, engineer or other appropriate end user.

Figure 2:
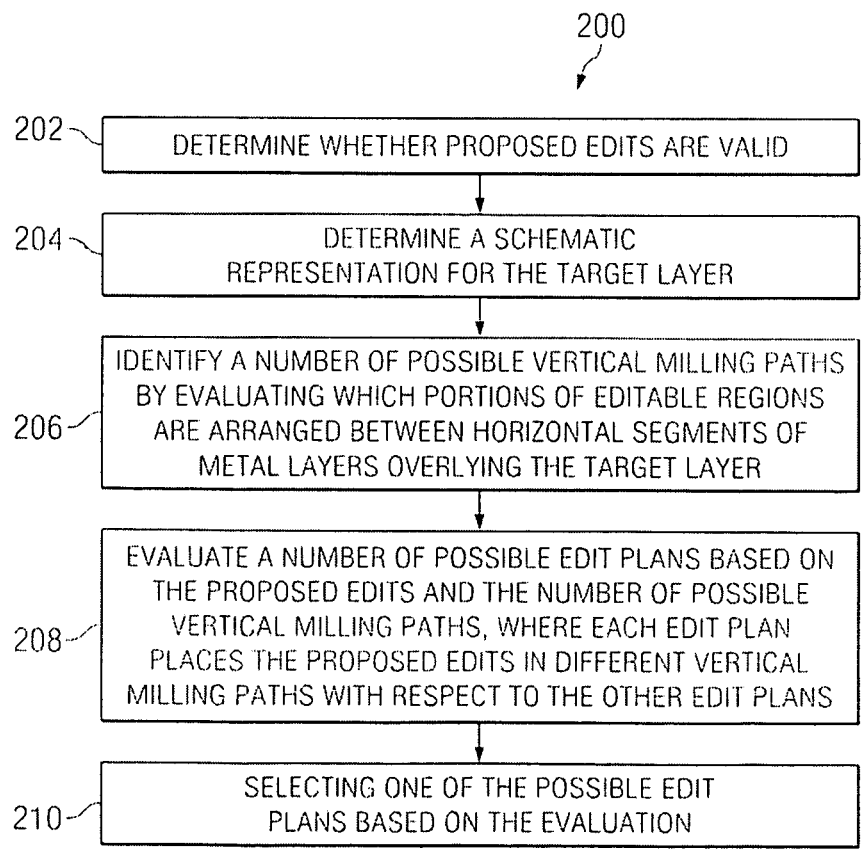
FIG. 2 shows a flow chart of a method in accordance with some embodiments.

Referring now to FIG. 2, one can see a method 200 carried out on the system 100. The method 200 includes several blocks (202 through 210) that collectively make one or more edits to a target layer of an integrated circuit. While this method 200 is illustrated and described as a series of blocks in FIG. 2, it will be appreciated that the present invention is not limited by the illustrated ordering of blocks. For example, some blocks may occur in different orders and/or concurrently with other blocks apart from those illustrated and/or described herein, in accordance with the invention. In addition, not all illustrated blocks may be required to implement a methodology in accordance with the present invention.

Whatever the ordering of the blocks (200 through 210), the edits proposed in the method 200 can take various forms. In some examples, an edit can be a cut-type of edit, where an existing conductive line of the target layer is severed. In other examples, an edit can be a strap-type edit, wherein contacts or vias and a bridge-like strap are formed over the target layer to couple two points of the target layer. Pad operations, in which a probe pad is added to the IC, and window operations, in which timing analysis is performed, can also be performed, among other types of edits. The method 200 can encompass various combinations of these and other edits.

FIGS. 3 through 6A-6I, which are discussed in more detail further below, show a more detailed embodiment where the proposed edits include a cut edit and strap edit. While FIGS. 3 through 6A-6I show one example consistent with method 200, FIGS. 3 through 6A-6I do not limit the manner in which the method 200 may be carried out. In these figures, the edits are to be made on a target layer 300. The target layer 300 includes a number of target layer segments 302, where each target layer segment 302 is arranged between a pair of branch points 304. For purposes of simplicity and clarity, a limited number of target layer segments 302 is illustrated, but it will appreciated that typical target layers 300 will have many more segments than illustrated. Vias, contacts and/or pads 306 often connect a target layer segment 302 or other portion of the target layer to other layers or devices under or above the target layer 300.

Figure 3:
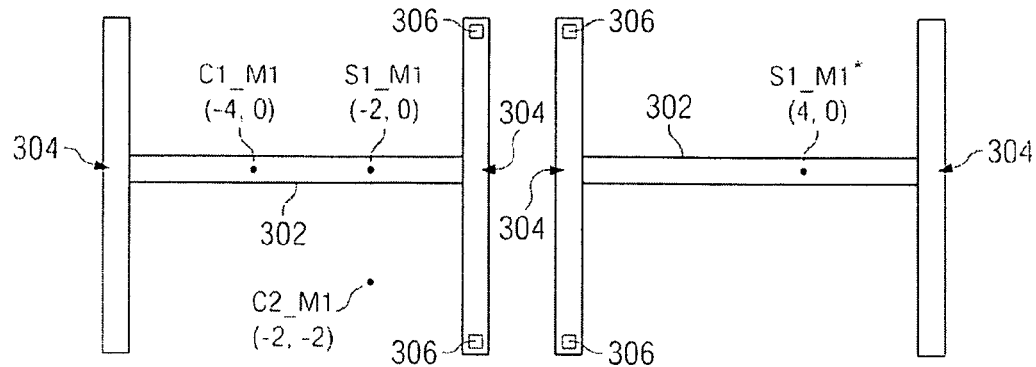
FIGS. 3 through 6A-6I show more detailed views of method sub-blocks consistent with FIG. 2's method.
Figure 4:
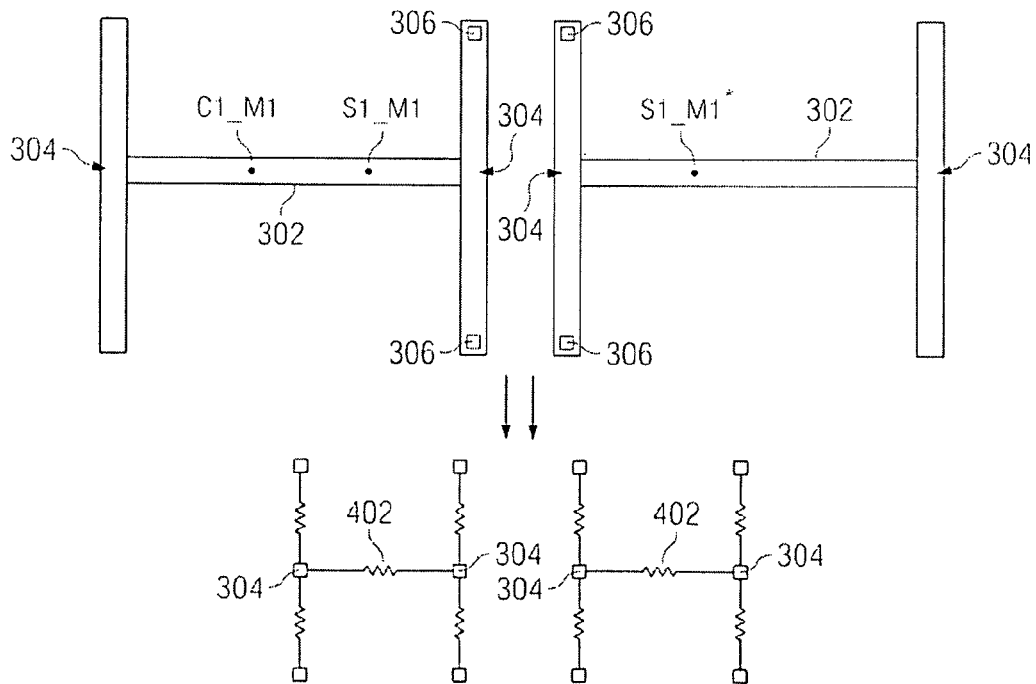

In FIG. 3, the method determines whether a proposed edit instruction is valid. Each proposed edit can be specified by an instruction having two parts: (1) a text identifier identifying a type of edit to be made to a particular target layer, and (2) a location identifier in the form of x, y coordinates. Thus, FIG. 3 shows three instructions for proposed edits which will be checked for validity. Instruction C1_M1 (−4, 0) indicates a cut is to be made to target layer metal 1 (M1) at coordinates (−4, 0). This instruction C1_M1 is deemed valid because the edit location falls on a segment 302 of the target layer 300. Similarly, instruction S1_M1 (−2, 0) is paired with S1_M1* (4, 0) to indicate that a strap is to be formed to couple the target layer 300 at points (−2, 0) and (4, 0). This instruction S1_M1/S1_M1* is also deemed valid because both locations fall on the target layer. By contrast, cut instruction C2_M1 at (−2, −2) relates to a location where a segment does not exist in the target layer. Therefore, instruction C2_M1 will be deemed invalid and is by definition unfeasible. The tool operator and/or other relevant party can be notified of the infeasibility of the instruction so the proposed edit can be suitably updated and re-submitted.

Assuming the edits are valid, the method continues on to evaluate whether the proposed edits are feasible and whether they can be improved upon. As a starting point for this feasibility determination, in FIG. 4 the method determines a schematic representation 400 for the target layer. Often, this schematic representation 400 is built of only resistor components 402. Each resistor 402 is bounded between a pair of branch points 304.

Figure 5A:
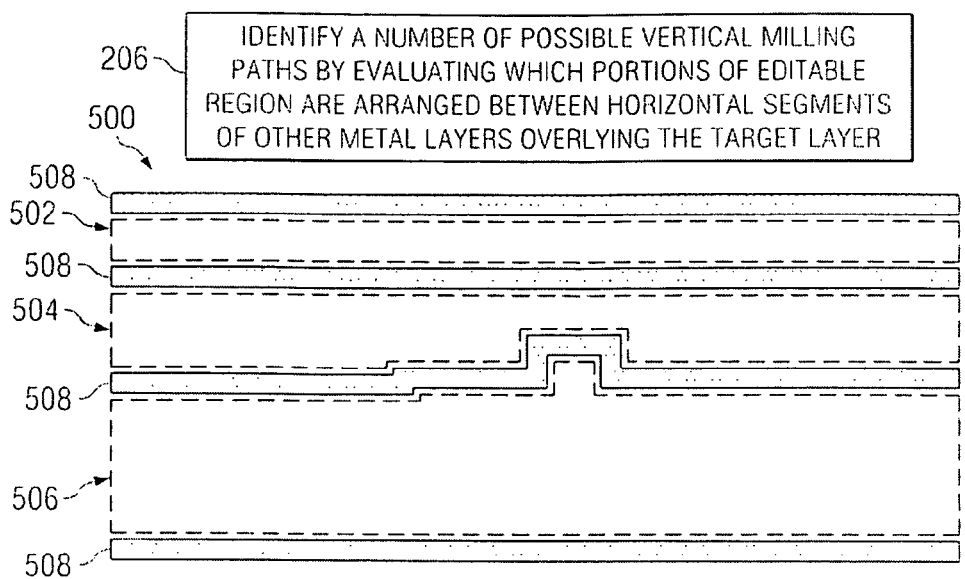
Figure 5B:
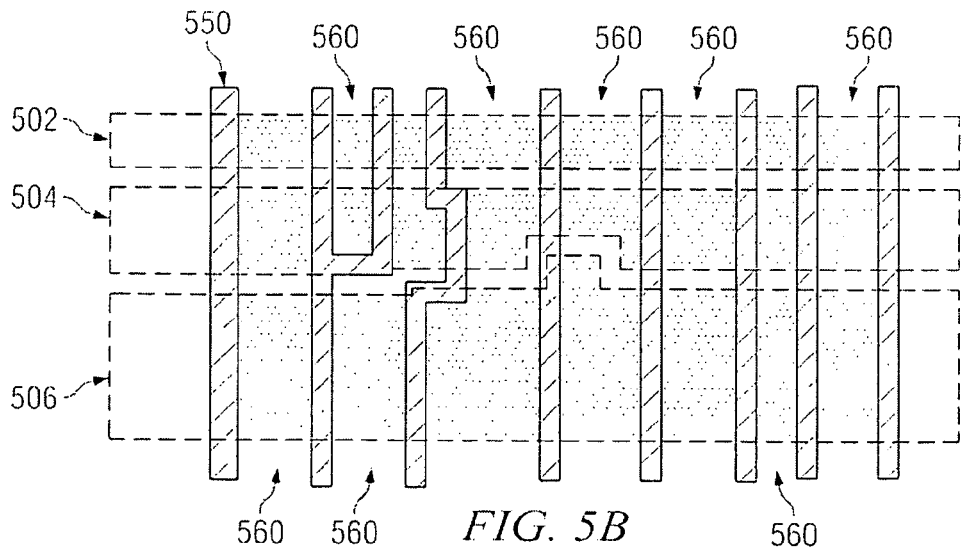
Figure 5C:
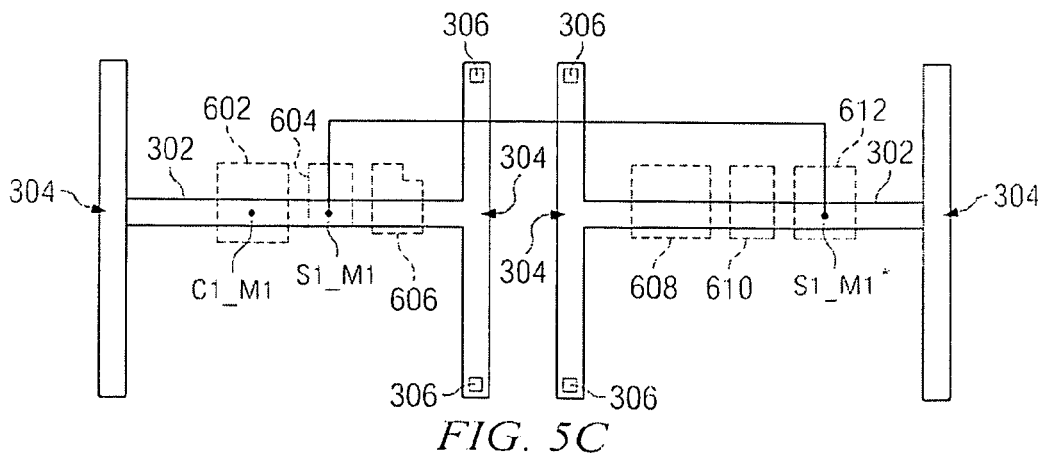

Once the schematic is determined for the target layer, the method proceeds to identify a number of possible vertical milling paths through which edits can be made without damaging the conductive layers overlying the target layer. This is shown in FIGS. 5A-5C. In FIG. 5A, which shows a first metal layer 500 (e.g., metal 2), the method determines first editable regions 502, 504, 506 that are laterally arranged between segments 508 of the metal layer.

In FIG. 5B, the method applies the first editable regions 502, 504, 506 to the second metal layer 550 (e.g., metal 3). More specifically, the method determines what portions of the first editable regions are arranged between segments of the second metal layer 550 (i.e., the method "whittles down" the first editable regions to fit between segments of the second metal layer). In this manner, second editable regions 560 are generated.

This "whittling down" process continues for each successive layer until a number of possible vertical milling paths are identified, as shown in FIG. 5C. These possible vertical milling paths are vertically aligned in view the schematic representation to achieve the proposed edits. Accordingly, in FIG. 5C the possible vertical milling paths (602, 604, 606, 608, 610, 612) correspond to regions of vertically continuous dielectric (i.e., regions not covered by metal layers overlying the target layer) that can be removed without damaging the operation of the integrated circuit.

In other embodiments, a number of editable regions could be separately determined for each metal layer, and the possible vertical milling paths could be identified by evaluating the vertically aligned overlap between the editable regions of successive metal layers.

In some embodiments, if the method is unable to determine any possible vertical milling paths by examining all of the overlying layers, the method can ignore all or part of the uppermost metal layer to determine possible vertical milling paths. This strategy can be employed because it is generally easier to repair the uppermost layer than underlying layers. Also, in some embodiments, the uppermost layer has greater pitch/width than other layers and can therefore be partially removed without seriously impacting functionality of the integrated circuit. In still other embodiments, if ignoring the uppermost layer does not allow access to the locations of the proposed edits, then successive layers can be ignored until access to the locations of proposed edits is gained through possible vertical milling paths.

Figure 6A:
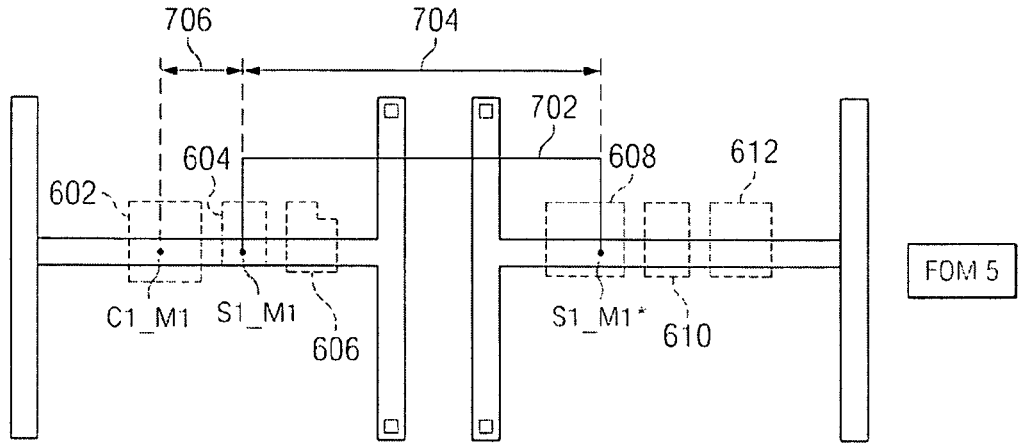
Figure 6B:
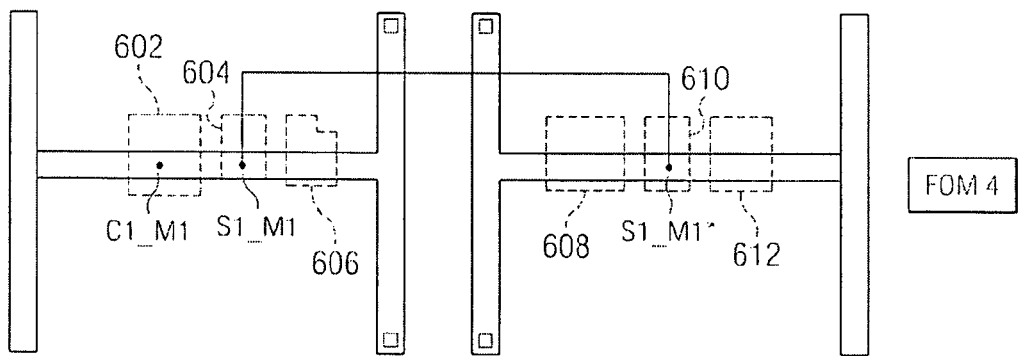
Figure 6C:
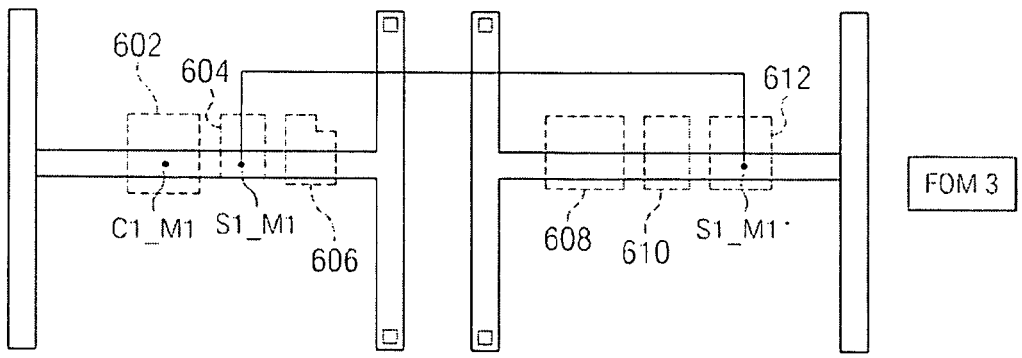
Figure 6D:
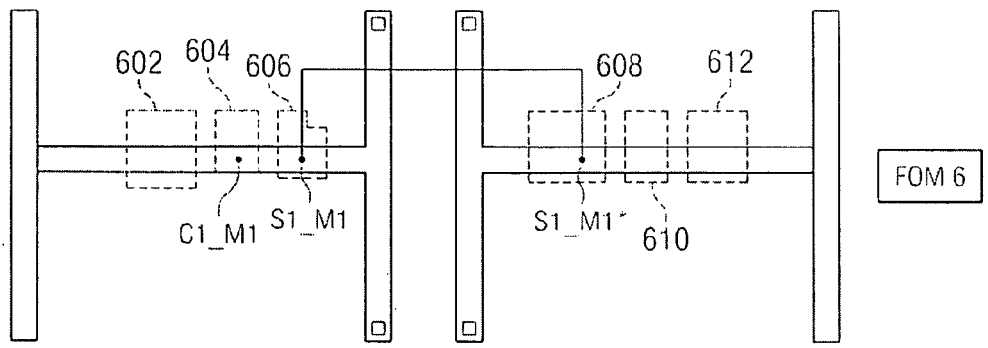
Figure 6E:
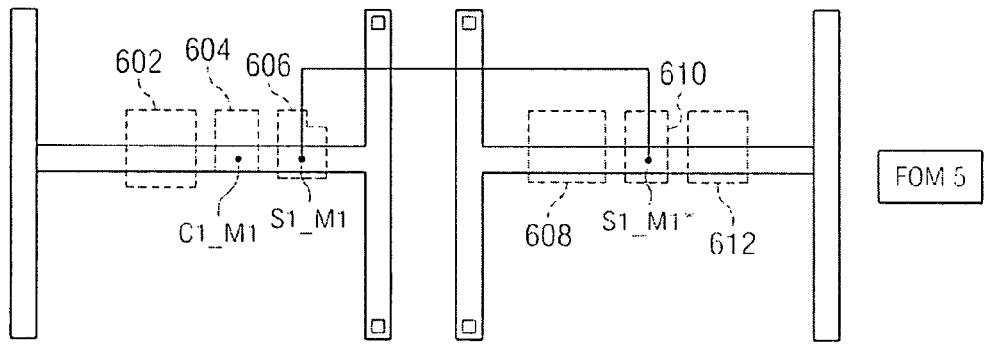
Figure 6F:
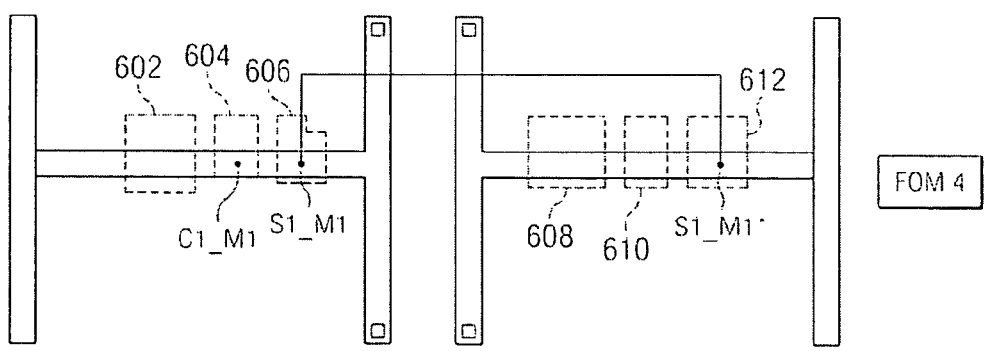

In any event, after the possible vertical milling paths are determined, in FIGS. 6A-6I, the method generates a number of possible edit plans based on these possible vertical milling paths. Each possible edit plan places the proposed edits in different possible vertical milling paths. For example, in FIG. 6A, cut C1_M1 is in vertical milling path 602, strap S1_M1 is in vertical milling path 604, and strap S1_M1* in vertical milling path 608. In FIG. 6B, strap S1_M1* has been moved to vertical milling path 610. The other FIGS. 6C-6I show other various combinations of the edit instructions.

Because each possible edit plan has edits in different locations, the edit plans will exhibit different behavior if actually implemented on a physical integrated circuit. To ensure that a desirable edit plan is selected for the actual edit on the physical integrated circuit, the method calculates a figure of merit for each possible edit plan. This figure of merit is often a weighted average of several pre-determined factors. The edit plan with the most favorable figure of merit is deemed the most feasible and is used to carry out the actual edit on the physical integrated circuit.

Often, the pre-determined factors used in calculating the figure of merit relate to the feasibility for various combinations of edits. Thus, feasibility can take into account properties of particular layers and characteristics of the FIB tools. For example, feasibility can consider the inability of the FIB tools to pattern an area less than some minimal dimension by using DRC rules. In our particular example, as the locations of a strap instruction and cut instruction are moved closer together (e.g., within about 1 um of each other), failures become more likely. Therefore, one pre-determined factor relates to a minimal distance between cut and strap instructions. If the locations of a strap instruction and cut instruction are separated by less than this minimal distance, they will be tend to receive a lower figure of merit than edits where the strap and cut are more than the minimal distance. Minimal spacing rules between other features can also be included. Also, it can desirable to limit the length of a strap to correspondingly limit its resistance. Other factors can also be included in calculating the figure of merit, which is often a weighted average of many different factors.

The following table summarizes the possible edits plans depicted in FIGS. 6A-6I, each of which shows a different possible edit plan for two proposed edits. The two proposed edits in these figures are as follows: (1) a cut C1_M1 at (−4,0), and (2) a strap S1_M1/S1_M1* running from (−2,0) to (4,0). For purposes of illustration, a figure of merit is assigned to each possible edit plan. Note the FOM in this example is merely for purposes of conceptual illustration and is not intended to be a precise characterization of the FOM for the actual system.

| FIG. | C1_M1 (Cut) | S1_M1 (strap) | S1_M1* (strap) | FOM |
| --- | --- | --- | --- | --- |
| FIG. 6A: Edit plan 1 | Milling path 602 | Milling path 604 | Milling path 608 | 5 |
| FIG. 6B: Edit plan 2 | Milling path 602 | Milling path 604 | Milling path 610 | 4 |
| FIG. 6C: Edit plan 3 | Milling path 602 | Milling path 604 | Milling path 610 | 3 |
| FIG. 6D: Edit plan 4 | Milling path 604 | Milling path 606 | Milling path 608 | 6 |
| FIG. 6D: Edit plan 4 | Milling path 604 | Milling path 606 | Milling path 610 | 5 |
| FIG. 6D: Edit plan 4 | Milling path 604 | Milling path 606 | Milling path 612 | 4 |
| FIG. 6D: Edit plan 4 | Milling path 602 | Milling path 606 | Milling path 608 | 7** |
| FIG. 6D: Edit plan 4 | Milling path 602 | Milling path 606 | Milling path 610 | 6 |
| FIG. 6D: Edit plan 4 | Milling path 602 | Milling path 606 | Milling path 612 | 5 |

Figure 6G:
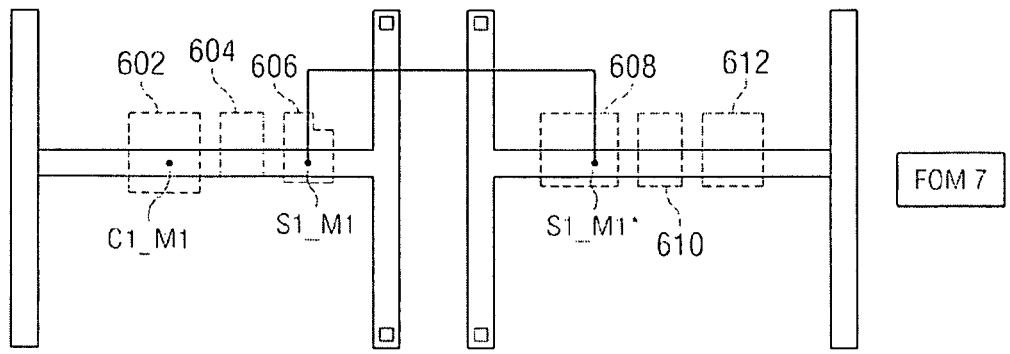
Figure 6H:
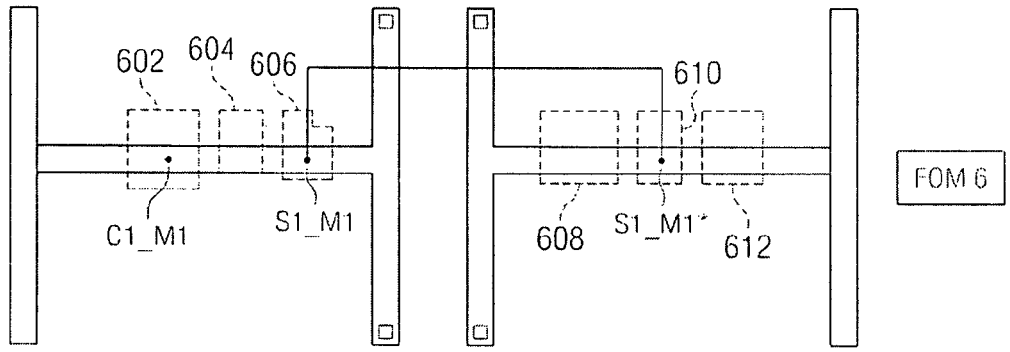
Figure 6I:
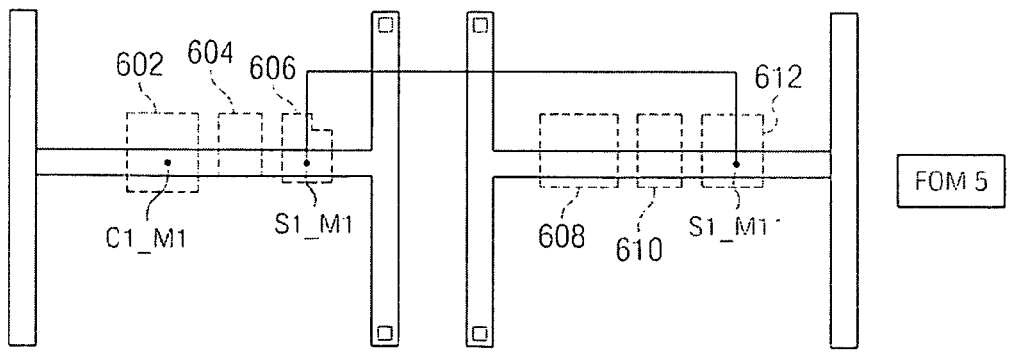

As indicated above, FIG. 6G's edit plan has the highest figure of merit (FOM). In this example this is primarily due to two factors. First in FIG. 6G, the strap 702 has a shorter length 704 than many of the other edit plans, which tends to be a favorable characteristic. Second, in FIG. 6G there is a sufficient spacing 706 between the locations of the strap and cut instructions. This also tends to be a favorable characteristic, thereby increasing the figure of merit for the edit plan.

Therefore, even though the method received a cut and strap instruction to be performed at particular locations, after evaluating the figure of merit for all possible edit plans the method will slightly adjust the proposed edits so that a more favorable edit is actually carried out on the physical integrated circuit. In this manner, the method presents an automated way of examining a number of possible solutions and choosing a desirable solution that may not have otherwise been contemplated by a designer or tool operator. This saves time and resources for both client companies and design companies.

While the example discussed above with regard to FIGS. 3 through 6A-6I has been discussed with regard to a target layer that is a metal 1 layer, the target layer could be another metal layer or a non-metal layer in other embodiments. Further, while the proposed edits discussed above constitute two edit commands (i.e., a cut instruction and a strap instruction), other proposed edits could include other number of edit commands, and may include edits to more than one target layer. Further still, although the example above discussed some examples of pre-determined factors that could be used, other pre-determined factors could also be used that may result in a different edit plan being selected. Consequently, the method discussed above can be extended to these and other scenarios, all of which are contemplated as falling within the scope of the present invention. Lastly, although some embodiments described above may be implemented with a vertical milling path having an angle of approximately 90° relative to the exterior surface of the integrated circuit, it will be appreciated that the present disclosure also contemplates vertical milling paths having angles other than 90°. For example, in some embodiments, a vertical milling path could have an angle of 30°, 45°, 60°, or any other angle relative to the exterior surface of the integrated circuit, where all such embodiments are contemplated as falling within the scope of the present disclosure.

Equivalent alterations and/or modifications may occur to those skilled in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein. Further, some regions that are illustrated as having distinct or abrupt edges may not be so precisely delineated, but may instead blend slightly with other regions. This is particularly true of doped or implanted regions that may diffuse with other regions, particularly at abutting edges.

What is claimed is:

1. A computer-implemented method of evaluating proposed edits to a target layer of an integrated circuit, comprising executing code on a processor to perform processes including:
   determining at a layout layer of integrated circuit design, with aid of the computer, a number of editable regions for metal layers overlying the target layer, wherein an editable region for a metal layer is laterally arranged between segments of the metal layer;
   identifying a number of possible vertical milling paths extending from an exterior surface of the integrated circuit to the target layer at the layout layer of integrated circuit design, each possible vertical milling path passing through at least one editable region;
   generating a number of possible edit plans that are based on both the proposed edits and the number of possible vertical milling paths, wherein each edit plan places possible edits that are based on the proposed edits in a different combination of possible vertical milling paths at the layout layer of integrated circuit design,
   calculating a figure of merit for each possible edit plan based on a set of predetermined factors, wherein the figures of merit for each possible edit plan are added together to form a sum for each possible edit plan, and
   selecting one of the number of possible edit plans to carry out an actual edit on a physical implementation of the integrated circuit, the selecting determined selecting an edit plan with the highest figure of merit.

2. The method of claim 1, wherein at least one of the pre-determined factors relates to a distance between locations of two proposed edits.

3. The method of claim 1, wherein the edit relates to milling to be carried out by a focused ion beam (FIB) tool.

4. The method of claim 1, further comprising determining a layout area of a design of representation for the target layer which includes a number of target layer segments, wherein a target layer segment is arranged between a pair of branch points from which at least two other target layer segments branch.

5. The computer-implemented method of claim 1, wherein said generating a number of possible edit plans occurs without an aid of a schematic.

6. The computer-implemented method of claim 5, wherein a cut is determined on a coordinate system that is determined on a physical layout of the integrated circuit.

7. The computer-implemented method of claim 1, wherein if no editable region is generated due to conflicts between layers of a multi-layer physical design, a first level of a multi-layer physical design layout is ignored to re-generate an editable region.

8. The computer-implemented method of claim 1, further comprising fracturing an editable region into a plurality of sub-regions, wherein each sub-region has its own additive figure of merit.

9. The computer-implemented method of claim 1, further comprising physically editing, with aid of an FIB, the physical implantation of the integrated circuit in the selected editable region.

10. A computer-implemented method of evaluating proposed edits to a target layer of an integrated circuit, comprising executing code on a processor to perform processes including:
    determining at a layout layer of integrated circuit design a layout representation for the target layer, with aid of the computer, which includes a number of target layer segments, wherein a target layer segment is arranged between a pair of branch points from which at least two other target layer segments branch;
    identifying a number of possible vertical milling paths extending from an exterior surface of the integrated circuit to the target layer at the layout layer of circuit design; and
    generating a number of possible edit plans by applying the proposed edits to the schematic representation in view of the number of possible vertical milling paths, wherein each edit plan places possible edits in different possible vertical milling paths at the layout layer of circuit design,
    calculating a figure of merit for each possible edit plan based on a set of predetermined factors, wherein the figures of merit for each possible edit plan are added together to form a sum for each possible edit plan, and
    selecting one of the number of possible edit plans to carry out an actual edit on a physical implementation of the integrated circuit, the selecting determined selecting an edit plan with the highest figure of merit.

11. The computer-implemented method of claim 10, wherein an initially proposed edit is located on the target layer segment; and wherein generating the number of possible edit plans further comprises moving the proposed edit to a different possible vertical milling path on the segment to produce a new proposed edit.

12. The computer-implemented method of claim 11, further comprising calculating a first figure of merit for the initially proposed edit; calculating a second figure of merit for the new proposed edit; and comparing the first and second figures of merit to select either the initially proposed edit or the new proposed edit.

13. The computer-implemented method of claim 12, further comprising carrying out the selected edit on a focused ion beam (FIB) tool.

14. The computer-implemented method of claim 4, further comprising determining whether an initially proposed edit falls on a target layer segment and within one of the number of possible vertical milling paths.

15. The computer-implemented method of claim 14, further comprising marking the initially proposed edit as unfeasible if the initially proposed edit does not fall on a target layer segment.

16. The computer-implemented method of claim 14, further comprising, if the initially proposed edit falls on a target layer segment but does not fall within one of the number of possible vertical milling paths, then moving the initially proposed edit to a new location on the target layer segment that falls within one of the number of possible vertical milling paths.

17. The computer-implemented method of claim 16, wherein the initially proposed edit comprises a cut instruction to sever the target layer segment.

18. The computer-implemented method of claim 16, wherein the initially proposed edit comprises a strap instruction to connect the target layer segment to another target layer segment by use of a conductive layer overlying the target layer.

19. The computer-implemented method of claim 10, wherein said generating a number of possible edit plans occurs without an aid of a schematic.

20. The computer-implemented method of claim 19, wherein a cut is determined on a coordinate system that is determined on a physical layout of the integrated circuit.

21. The computer-implemented method of claim 10, further comprising fracturing an editable region into a plurality of sub-regions, wherein each sub-region has its own additive figure of merit.

22. The computer-implemented method of claim 10, further comprising physically editing, with aid of an FIB, the physical implantation of the integrated circuit in the selected editable region.

23. The computer-implemented method of claim 10, wherein if no editable region is generated due to conflicts between layers of a multi-layer physical design, a first level of a multi-layer physical design layout is ignored to re-generate an editable region.

* * * * *